United States Patent [19]

Tan et al.

[11] Patent Number: 5,674,657
[45] Date of Patent: Oct. 7, 1997

[54] POSITIVE-WORKING PHOTORESIST COMPOSITIONS COMPRISING AN ALKALI-SOLUBLE NOVOLAK RESIN MADE WITH FOUR PHENOLIC MONOMERS

[75] Inventors: Shiro Tan, Yaizu; Yasumasa Kawabe, Shimada, both of Japan; Kenji Honda, Barrington, R.I.

[73] Assignees: Olin Microelectronic Chemicals, Inc., Norwalk, Conn.; Fuji Photo Film Co., Ltd., Shizuoka, Japan

[21] Appl. No.: 743,592

[22] Filed: Nov. 4, 1996

[51] Int. Cl.⁶ .................................. G03F 7/023
[52] U.S. Cl. .................. 430/191; 430/192; 430/193; 528/155
[58] Field of Search .................. 430/165, 192, 430/193, 191; 528/155

[56] References Cited

U.S. PATENT DOCUMENTS

| | | | |
|---|---|---|---|
| 4,719,167 | 1/1988 | Miura et al. | 430/192 |
| 5,087,548 | 2/1992 | Hosaka et al. | 430/192 |
| 5,110,706 | 5/1992 | Yumoto et al. | 430/191 |
| 5,225,311 | 7/1993 | Nakano et al. | 430/192 |
| 5,238,775 | 8/1993 | Kajita et al. | 430/192 |
| 5,322,757 | 6/1994 | Ebersole | 528/155 |
| 5,324,620 | 6/1994 | Ebersole | 430/192 |
| 5,460,917 | 10/1995 | Kobayashi et al. | 430/191 |

FOREIGN PATENT DOCUMENTS 2-93651  4/1990  Japan.

*Primary Examiner*—John S. Chu
*Attorney, Agent, or Firm*—Todd E. Garabedian; William A. Simons; Wiggin & Dana

[57] ABSTRACT

The invention is directed to an alkali-soluble novolak binder resin composition made by addition condensation reaction of a phenolic mixture with at least one aldehyde source, the feedstock of said phenolic mixture for the reaction comprising about 33 to about 83 mole percent of meta-cresol; about 1 to about 4 mole percent of para-cresol; about 10 to about 60 mole percent of a phenolic monomer selected from the group consisting of 2,3-xylenol, 3,4-xylenol, 3,5-xylenol and mixtures thereof; and about 5 to about 55 mole percent of a methoxy phenol monomer, the amount of aldehyde source being from about 40 to about 200 percent of the stoichiometric amount needed to react with all of the phenolic moieties in said phenolic mixture, and the alkali-soluble novolak binder resin having a weight average molecular weight ($M_w$) of about 3,000 to about 20,000 with a molecular weight polydispersity ($M_w/M_n$) of 1.5–4.0. The invention is also directed to a positive working photoresist made from the composition.

14 Claims, No Drawings

POSITIVE-WORKING PHOTORESIST COMPOSITIONS COMPRISING AN ALKALI-SOLUBLE NOVOLAK RESIN MADE WITH FOUR PHENOLIC MONOMERS

BACKGROUND OF THE INVENTION

1. The Field of the Invention

This invention relates to a radiation-sensitive compositions. In particular, this invention relates to positive-working radiation-sensitive compositions useful as photoresists that have high resolution, high sensitivity, and good photo-image quality.

2. Brief Description of the Art

As integrated circuits (IC) devices become higher in memory density, photolithographic image patterns formed on wafers are required with less than 0.3 micron in resolution. To achieve this goal, photoresists used for photolithographic imaging are required to have a higher resolution, faster sensitivity, and more vertical profile than the state-of-the-art photoresists of a decade ago.

Most common g/i-line positive working-type photoresists currently used in IC device manufacture consist of an alkaline-soluble polymer (e.g., novolak resin) as a binder resin, and a naphthoquinonediazide (DNQ) ester of a polyphenol compound as the photoactive compound. For example, combinations of novolak-type phenol resins and DNQ esters as a positive-working photoresist are disclosed in U.S. Pat. Nos. 3,666,473, 4,115,128, and 4,173,470. A photoresist composition of cresol formaldehyde novolak and a DNQ ester of trihydroxybenzophenone is also described in "Introduction to Microlithography" edited by L. F. Thompson (ACS Publishing No. 219, p 112–121) as a typical example.

Photoresist performance is influenced by various factors; e.g., structures of the binder resins, photoactive compounds, and other additives, combinations of these components as well as exposure, development and other process parameters. In particular, the structure/property relationship of the binder resins is one of the most complicated subjects.

Binder resins useful for high-performance photoresist formulations, especially for the g/i-line application are selected from the group of novolak resins which are prepared by addition-condensation reaction of various phenolic derivatives with various aldehydes or ketones in the presence of acids such as oxalic acid, sulfuric acid, and the like. Among various phenolic derivatives used as a monomer of the novolak resins, meta-cresol and para-cresol are some of the most useful monomers. Most novolak resins are made of various combinations of meta-cresol, para-cresol and other co-monomers such as xylenols:

(1) JP 2-93651 teaches the use of a combination of meta-cresol, para-cresol, xylenols and methoxyphenols for the novolak synthesis. The disclosure does not recite any specific composition of these monomers in the feed, or a molecular weight of the resulting polymer. However, all the examples shown in this patent application describe that a mole ratio of para-cresol in the feedstock of the phenolic monomers is in the range from 20% to 53%, a relatively high concentration of para-cresol.

(2) JP 6-54386 teaches the use of a combination of meta-cresol and the compound shown in Formula [1], wherein X is selected from —CH$_3$, —C$_2$H$_5$, —C(CH$_3$)$_3$, —COOCH$_3$, and —COOC$_2$H$_5$; Ph is a phenyl group; n is an integer from 1 to 3; and m is an integer from 1 to 3:

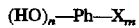
(1)

The compounds defined by Formula (1) include xylenols and methoxyphenols but do not include pars-cresol.

(3) JP 3-54565 discloses the use of a combination of meta-cresol, para-cresol, and at least one more phenolic compound selected from the group defined by Formula [2], wherein R$_1$–R$_3$ are the same or different and hydrogen, hydroxyl or R$_4$, OR$_4$ or COOR$_4$ where R$_4$ is an alkyl group having 1–4 carbon atoms:

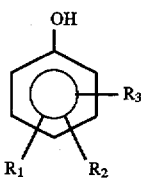
(2)

Both the monomer structure and the polymer structure are critical in determining the photoresist performance. For example, a molecular weight and molecular weight dispersity of the novolak resins are important. In general, the molecular weight affects thermal properties, such as heat resistance, and dissolution speed in a developer such as an aqueous solution of tetramethylammonium hydroxide (TMAH). In general, as the molecular weight increases, the heat resistance increases and the dissolution rate decreases. On the other hand, the molecular weight dispersity affects resolution and pattern profile in the photoresist performance such that the narrower the dispersity, the better the performance. Hence, novolak resins are fractionated, especially for high-performance i-line photoresist formulations, so as to decrease molecular weight dispersity. Several methods have been applied to novolak resin fractionation. For example, one of the most popular methods is solvent fractionation. Recently, super critical fluid fractionation has become an alternative to conventional solvent fractionation methods because this method does not produce solvent wastes that are difficult to dispose.

Today, an advanced i-line photoresist is required to provide a resolution less than 0.3 micron that is close to a theoretical limit of resolution of i-line lithography. Therefore, new lithography techniques with a shorter wavelength exposure, such as deep UV lithography, is urgently desired in actual IC device fabrication. However, due to technical barriers in the deep UV lithography techniques, such as availability of useful deep UV resist or exposure tools, i-line photoresists continue to be important materials in current lithographic applications. Accordingly, further improvements of the i-line photoresists are required. To meet this requirement for leading-edge i-line lithography, the photoresist components, such as binder resins and photoactive compounds, must be designed to give increased performance. The present invention meets this requirement by making novel novolak resins.

BRIEF SUMMARY OF THE INVENTION

Therefore, one aspect of the present invention is directed to an alkali-soluble novolak binder resin made by addition-condensation reaction of a phenolic mixture with at least one aldehyde source, the feedstock of said phenolic mixture for said reaction comprising:

(1) about 33 to about 83 mole percent of said phenolic mixture being meta-cresol (also known as m-cresol);

(2) about 2 to about 4 mole percent of said phenolic mixture being para-cresol (also known as p-cresol);

(3) about 10 to about 60 mole percent of said phenolic mixture being a phenolic monomer selected from the group consisting of 2,3-xylenol, 3,4-xylenol, 3,5-xylenol and mixtures thereof; and (4) about 5 to about 55 mole percent of said phenolic mixture being a methoxyphenol monomer selected from the group consisting of para-methoxyphenol, meta-methoxyphenol, ortho-methoxyphenol and mixtures thereof;

the amount of said aldehyde source being from about 40 percent to about 200 percent of the stoichiometric amount needed to react with all of the phenolic moieties in said phenolic mixture; and said alkali-soluble novolak binder resin having a weight average molecular weight ($M_w$) of about 3,000 to about 20,000 with a molecular weight polydispersity ($M_w/M_n$) of 1.5–4.0 and a dissolution rate in a 2.38 percent by weight aqueous solution of tetramethylammonium hydroxide (TMAH) of 3–100 angstroms per second at 23° C.

A second aspect of the present invention is directed to a positive-working photoresist composition comprising an admixture of:

(A) the above-noted alkali-soluble novolak binder resin;

(B) at least one photoactive compound; the amount of said photoactive compound or compounds being about 35 to 100 percent by weight of said novolak binder resin; and (C) at least one polyhydroxy compound having 2 to 7 phenolic groups and a weight average molecular weight ($M_w$) below 1,000; the amount of said polyhydroxy compound or compounds being about 10 to 60 percent by weight of said novalak binder resin.

Still further, the present invention also encompasses the process of coating substrates with these radiation sensitive mixtures and then exposing and developing these coated substrates.

Also further, the present invention encompasses said coated substrates (both before and after imaging) as novel articles of manufacture.

DETAILED DESCRIPTION OF THE PREFERRED EMBODIMENTS OF THE INVENTION

An alkaline-soluble novolak resin is provided by the reaction of aldehyde with phenolic monomers containing (1) m-cresol; (2) p-cresol; (3) xylenol (selected from 2,3-xylenol, 3,4-xylenol, and 3,5-xylenol); and (4) methoxyphenol (selected from p-, m-, and o-methoxyphenols). These monomers of (1), (2), (3), and (4) can also be used as the methylolated derivatives.

Preferred molar ratios of m-cresol, p-cresol, xylenol (at least one of 2,3-xylenol, 3,4-xylenol, and 3,5-xylenol), and at least one of methoxyphenol (p-, m-, or o-methoxyphenol) in the feedstock of the reaction mixture are as follows:

| Phenolic Compound | Preferred (mol %) | More Preferred (mol %) | Most Preferred (mol %) |
|---|---|---|---|
| m-cresol | 33–83 | 40–70 | 45–60 |
| p-cresol | 2–4 | 2–4 | 1–2 |
| xylenol | 10–60 | 15–45 | 15–30 |
| methoxyphenol | 5–55 | 10–40 | 15–30 |

In general, the addition of methoxyphenol tends to increase depth of focus (DOF) and photospeed.

Aldehyde used in this invention includes formaldehyde, paraformaldehyde, trioxane, acetaldehyde, and chloroacetaldehyde. Among these, formaldehyde and paraformaldehyde are preferable. In addition, mixtures of more than two different aldehydes can be used. The amount of aldehyde added is in the range from about 0.4 mol. percent to about 2.0 mol. percent per phenol unit. The preferable amount of aldehyde is in the range from about 0.5 to about 1.5 mol. percent and about 0.6 to about 1.2 mol. percent is more desirable because these conditions lead to the production of a novolak resin which has a good balance of photospeed, resolution, and DOF.

The acid catalyst used for the addition-condensation reaction includes hydrochloric acid, sulfuric acid, formic acid, acetic acid, oxalic acid, and the like. Oxalic acid is preferable due to low residual content by decomposition after high-thermal processing.

The novolak resin used in this invention has $M_w$=3,000–20,000; preferably 4,000–18,000, and more preferably 5,000–16,000. It has been found that at $M_w$ values of less than about 3,000, film thickness loss of unexposed photoresist by alkali development is severe. On the other hand, at $M_w$ of more than about 20,000, photospeed deteriorates. $M_w$ ranges of about 3,000 to about 20,000 are observed to perform best because operating parameters such as photospeed, resolution, and DOF, as well as scum formation and heat resistance are balanced.

The method of removal of low molecular weight fractions from novolak resins is mentioned in Japanese Patent Application (Kokai) Nos. 60-45238, 60-93347, 60-140235, 60-189739, 64-14299, 1-276131, 2-60915, 2-275955, 2-282746, 4-101147, and 4-122938. For example, precipitation fractionation, solution fractionation, column chromatography, supercritical fluid fractionation, and other like methods may be employed for this purpose. A preferable quantity of components removed by fractionation is in the range from 20 weight percent to 70 weight percent and more preferably 30 weight percent to 60 weight percent of the lower molecular weight portions from a whole area of Gaussian distribution of the molecular weight of unfractionated novolak resin. A preferred polydispersity ($P_d$) of the molecular weight of the resin after removal of the lower molecular weight components is 1.8–3.5, and more preferably 2.0–3.3. If $P_d$ exceeds 4, lithographic performance is reduced. As used herein, $P_d$ is the ratio of weight average molecular weight ($M_w$) to number average molecular weight ($M_n$), i.e., $P_d = M_w/M_n$.

The dissolution rate of the novolak resin in 2.38% TMAH is preferably in the range of 3 to 100 Å/sec at 23° C., and more preferably in the range of 5–95 Å/sec, and most preferably in the range of 10–90 Å/sec. Photoresist systems having alkali dissolution rates in these ranges have an appropriate balance of photospeed, resolution and DOF. To adjust the dissolution rate of the novolak resin, it is also possible to blend more than two novolak resins.

To enhance the heat resistance of the novolak resin, the blending of poly(hydroxystyrene) or its chemically-modified derivatives, acetone-pyrogallic acid resin, and acetone-resorcinol resin with the novolak resin disclosed in this invention may be preferred.

The photoactive component (hereafter referred to as PAC) used in the present invention is provided by esterification of 1,2-napthoquinonediazide-5-sulfonyl chloride and/or 1,2-naphthoquinonediazide-4-sulfonyl chloride with a polyhydroxy compound having 2–7 phenolic moieties and in the presence of basic catalyst.

Preferably, the number of the phenolic moieties per one molecule of the polyhydroxy compound used as a backbone of PAC is in the range of 2–7, and more preferably in the range of 3–5.

Some representative examples of polyhydroxy compounds are:

(a) Polyhydroxybenzophenones such as 2,3,4-trihydroxybenzophenone, 2,4,4'-trihydroxybenzophenone, 2,4,6-trihydroxybenzophenone, 2,3,4-trihydroxy-2'-methylbenzophenone, 2,3,4,4'-tetrahydroxybenzophenone, 2,2'4,4'-tetrahydroxybenzophenone, 2,4,6,3',4'-pentahydroxybenzophenone, 2,3,4,2',4'-pentahydroxybenzophenone, 2,3,4,2',5'-pentahydroxybenzophenone, 2,4,6,3',4',5'-hexahydroxybenzophenone, and 2,3,4,3',4',5'-hexahydroxybenzophenone.

(b) Polyhydroxyphenylalkylketones such as 2,3,4-trihydroxyacetophenone, 2,3,4-trihydroxyphenylpentylketone, and 2,3,4-trihydroxyphenylhexylketone.

(c) Bis(polyhydroxyphenyl)alkanes such as bis(2,3,4-trihydroxyphenyl)methane, bis(2,4-dihydroxyphenyl)methane, and bis(2,3,4-trihydroxyphenyl)propane.

(d) Polyhydroxybenzoates such as propyl 3,4,5-trihydroxybenzoate, phenyl 2,3,4-trihydroxybenzoat, and phenyl 3,4,5-trihydroxybenzoate.

(e) Bis(polyhydroxybenzoyl)alkanes or bis(polyhydroxybenzoyl)aryls such as bis(2,3,4-trihydroxybenzoyl)methane, bis(3-acetyl-4,5,6-trihydroxyphenyl)methane, bis(2,3,4-trihydroxybenzoyl)benzene, and bis(2,4,6-trihydroxybenzoyl)benzene.

(f) Alkylene di(polyhydroxybenzoates) such as ethyleneglycol-di(3,5-dihydroxybenzoate) and ethylene glycoldi(3,4,5-trihydroxybenzoate).

(g) Polyhydroxybiphenyls such as 2,3,4-biphenyltriol, 3,4,5-biphenyltriol, 3,5,3'5'-biphenyltetrol, 2,4,2',4'-biphenyltetrol, 2,4,6,3',5'-biphenylpentol, 2,4,6,2',4',6'-biphenylhexol, and 2,3,4,2',3',4'-biphenylhexol.

(h) Bis(polyhydroxy)sulfides such as 4,4'-thiobis(1,3-dihydroxy)benzene.

(i) Bis(polyhydroxyphenyl)ethers such as 2,2'4,4'-tetrahydroxydiphenyl ether.

(j) Bis(polyhydroxyphenyl)sulfoxides such as 2,2'4,4'-tetrahydroxydiphenylsulfoxide.

(k) Bis(polyhydroxyphenyl)sulfones such as 2,2',4,4'-tetrahydroxydiphenylsulfone.

(l) Polyhydroxytriphenylmethanes such as tris(4-hydroxyphenyl)methane), 4,4',4"-trihydroxy-3,5,3',5'-tetramethyltriphenylmethane, 4,4',3",4"-tetrahydroxy-3,5,3',5'-tetramethyltriphenylmethane, 4,4',2",3",4"-pentahydroxy-3,5,3',5'-tetramethyltriphenylmethane, 2,3,4,2',3',4'-hexahydroxy-5,5'-diacetyltriphenylmethane, 2,3,4,2',3',4',3",4"-octahydroxy-5,5'-diacetyltriphenylmethane, and 2,4,6,2',4',6'-hexahydroxy-5,5'-dipropionyltriphenylmethane.

(m) Polyhydroxy-spirobi-indanes such as 3,3,3',3',-tetramethyl-1,1'-spirobi-indane-5,6,5',6'-tetrol, 3,3,3'3'-tetramethyl-1,1'-spirobi-indane-5,6,7,6'6',7'-hexol, and 3,3,3'3'-tetramethyl-1,1'-spirobi-indane-4,5,6,4',5',6'-hexol.

(n) Polyhydroxyphthalides such as 3,3-bis(3,4-dihydroxyphenyl)phthalide, 3,3-bis(2,3,4-trihydroxyphenyl)phthalide, and 3',4',5',6'-tetrahydroxyspiro(phthalide-3,9'-xanthene).

(o) Polyhydroxy compounds described in JP No. 4-253058 such as alpha, alpha'alpha"-tris(4-hydroxyphenyl)-1,3,5-triisopropylbenzene, alpha, alpha', alpha"-tris(3,5-dimethyl-4-hydroxyphenyl)-1,3,5-triisopropylbenzene, alpha, alpha', alpha"-tris (3,5-diethyl-4-hydroxyphenyl)-1,3,5-triisopropylbenzene, alpha, alpha', alpha"-tris (3,5-di-n-propyl-4-hydroxyphenyl)-1,3,5-triisopropylbenzene, alpha, alpha',alpha"-tris(3,5-diisopropyl-4-hydroxyphenyl)-1,3,5-triisopropylbenzene, alpha, alpha', alpha"-tris(3,5-di-n-butyl-4-hydroxyphenyl)-1,3,5-triisopropylbenzene, alpha, alpha', alpha"-tris(3-methyl-4-hydroxyphenyl)-1,3,5 -triisopropylbenzene, alpha, alpha', alpha"-tris(3-methoxy-4-hydroxyphenyl)-1,3,5-triisopropylbenzene, alpha, alpha', alpha"-tris(2,4-dihydroxyphenyl)-1,3,5-triisopropylbenzene, 2,4,6-tris(3,5-dimethyl-4-hydroxyphenylthiomethyl)mesitylene, 1-[alpha-methyl-alpha-(4'-hydroxyphenyl)ethyl]-4-[alpha, alpha'-bis(4"-hydroxyphenyl)ethyl]benzene, 1-[alpha-methyl-alpha-(4'-hydroxyphenyl)ethyl]-3-[alpha, alpha'-bis(4"-hydroxyphenyl)ethyl]benzene, 1-[alpha-methyl-alpha-(3',5'-dimethyl-4'-hydroxyphenyl)ethyl]benzene, 1-[alpha-methyl-alpha-(3'-methoxy-4'-hydroxyphenyl)ethyl]-4-[alpha',alpha'-bis(3"-methoxy-4"-hydroxyphenyl)ethyl]benzene, and 1-[alpha-methyl-alpha-(2',4'-dihydroxyphenyl)ethyl]-4-[alpha',alpha'-bis(4"-hydroxyphenyl)ethyl]benzene.

Another candidate of the backbone of the PAC is a low molecular weight novolak resin.

The esterification step for the PAC synthesis is carried out with a basic catalyst such as sodium hydroxide, sodium carbonate, triethylamine, N-methylmorpholine, N-methyldiethylenediamine, 4-dimethylaminopyridine, or combinations thereof.

The following solvents are useful in the reaction: dioxane, acetone, tetrahydrofuran, methyl ketone, N-methyl-2-pyrrolidone, chloroform, methyl chloroform, trichloroethylene, dichloroethane, or combinations thereof.

The degree of the esterification can be controlled by adjusting a molar ratio of the polyhydroxy compound to 1,2-naphthoquinonediazide-5- (and/or -4-) sulfonyl chloride where the degree of the esterification is defined as a mole percent of the phenolic hydroxyl group of the polyhydroxy compound incorporated with DNQ moiety. The degree of esterification of the polyhydroxy backbone can be controlled by adjusting the molar ratio of the hydroxyl groups bound to the polyhydroxy backbone to DNQ chloride moieties in the feedstock. Preferably, this ratio is greater than 1.0 so that not all available hydroxyl groups are derivitized with DNQ moieties.

A low molecular weight alkaline-soluble resin can be used as a replacement for the polyhydroxy compound mentioned above or as an admixture therewith for the esterification.

The amount of PAC in the feedstock is in the range of 35–100 parts by weight per 100 parts of novolak resin, and preferably 40–90 parts by weight per 100 parts of novolak resin. If the PAC amount is below 35 parts by weight to the resin, film loss becomes problematic. On the other hand, if the PAC amount exceeds 100 parts by weight, the solubility of the resulting ester to solvent becomes poor and the photospeed decreases.

The speed enhancer used in this invention is a polyhydroxy compound having 2–7 phenolic hydroxyl groups and molecular weight less than 1,000; preferably, the speed enhancer has 2–6 phenolic hydroxyl groups and a molecular weight of 150–1000, and more preferably 250–600. The reason for addition of the speed enhancer to the photoresist composition is to adjust photospeed and improve resolution and DOF.

Preferable speed enhancers used in the present invention are resorcin, phloroglucinol, 2,3,4-trihydroxybenzophenone, 2,3,4,4'-tetrahydroxybenzophenone, 2,3,4,3',4',5'-hexahydroxybenzophenone, acetone-pyrogallol condensate, phloroglucide, 2,4,3',4'-biphenyltetrol, 4,4'-thio-bis(1,3-dihydroxybenzene), 2,2',4,4'-tetrahydroxydiphenyl ether, 2,2',4,4'-tetrahydroxydiphenylsulfoxide, 2,2',4,4'-tetrahydroxydiphenylsulfone, tris(4-hydroxyphenyl) methane, 1,1-bis(4-hydroxyphenyl)bisphenol, alpha,alpha, alpha',alpha"-tris(4-hydroxyphenyl)-1,3,5-triisopropylbenzene, alpha,alpha',alpha"-tris(4-hydroxyphenyl)-1-ethyl-4-isopropyl benzene, 1,2,2-tris(3,5-dimethyl-4-hydroxyphenyl)dimethylmethane, 2,2,5,5-tetrakis(4-hydroxyphenyl)hexane, 1,2-tetrakis(4-hydroxyphenyl)ethane, 1,1,3-tris(hydroxyphenyl)butane, and [alpha,alpha, alpha',alpha'-tetrakis(4-hydroxyphenyl)]-dimethylbenzene.

The amount of the speed enhancer added to the composition of the invention is preferably in the range of 10–60 parts by weight to 100 parts by weight of alkaline-soluble resin, and more preferably 20–50 parts by weight.

The solvents included in the photoresist composition of the present invention are used to dissolve the photosensitive compound, alkaline-soluble novolak resin and speed enhancer. Useful solvents include, but are not limited to, ethyleneglycol monomethyl ether, ethyleneglycol monoethyl ether, ethyleneglycol monoethyl ether acetate, propyleneglycol methyl ether acetate, propyleneglycol propyl ether acetate, methylbenzene, dimethylbenzene, methylethyl ketone, cyclohexanone, ethyl-2-hydroxypropionate, ethyl-2-hydroxy-2-methyl propionate, ethyl hydroxyacetate, 2-hydroxy-3-methyl butanoate, methyl-3-methoxy propionate, ethyl-3-methoxy propionate, ethyl-3-ethoxy propionate, methyl-3-ethoxy propionate, methyl pyruvate, ethyl pyruvate, butyl acetate, ethyl lactate, and propyleneglycol monomethylether propionate. These organic solvents may be used either individually or in combination.

A high boiling point solvent such as N-methylformamide, N,N-dimethyl formamide, N-methyl acetamide, N-dimethyl acetamide, N-methyl-2-pyrrolidone, dimethylsulfoxide, or benzylethyl ester may be used in the above-mentioned solvents either individually or in combination and at various ratios.

An anti-striation or leveling agent may also be added to the photoresist composition in order to produce a uniform coating of the resist film on wafers without striation. Such anti-striation or leveling agents level out the resist coating or film to a uniform thickness. In other words, the leveling agent is used to eliminate the formation of striations on the surface of the resist coating once the coating is spun onto the substrate surface. Anti-striation agents may be used up to 5% by weight to a total weight of solids in the resist formulation. One suitable class of anti-striation agents is nonionic silicon-modified polymers. A preferred compound is TROYKYD 366 made by Troy Chemical Co., Newark, N.J. Another suitable class of antistriation agents is fluoroaliphatic polymeric ester surfactants. A preferred compound is FC-430 FLUORAD made by 3M of St. Paul, Minn. Nonionic surfactants may also be used for this purpose, including, for example, nonylphenoxy poly(ethyleneoxy) ethanol; octylphenoxy (ethyleneoxy) ethanol; and dinonyl phenoxy poly(ethyleneoxy) ethanol; polyoxyethylene lauryl ether; polyoxyethylene oleyl ether; polyoxyethylene octylphenyl ether; polyoxyethylene nonylphenyl ether; polyoxyethylene glycol dilaurate; and polyoxyethylene glycol distearate. Also maybe useful are organosiloxane polymers and acrylic acid-containing or methacrylate acid-containing polymers. Other examples of anti-striation or leveling agents include:

(a) a family of polyoxyethylene alkyl ethers such as polyoxyethylene lauryl ether, polyoxyethylene stearyl ether, polyoxyethylene cetyl ether, and polyoxyethylene oleyl ether;

(b) a family of polyoxyethylene alkyl aryl ethers such as polyoxyethylene nonylphenyl ether, and polyoxyethylene polyoxypropylene block copolymers;

(c) solbitan fatty acid esters such as solbitan monolaurate, solbitan monopalmitate, and solbitan monostearate;

(d) a family of fatty acid esters of polyoxyethylene solbitan such as polyoxyethylene solbitan monolaurate, polyoxyethylene eolbitan monopalmitate, polyoxyethylene solbitan monostearate, and polyoxyethylene solbitan monotristearate.

Preferably, the amount of anti-striation or leveling agent in the composition of the invention should not exceed two parts by weight per 100 parts by weight of the alkaline-soluble resin and PAC. Preferably, the amount does not exceed one part by weight. These anti-striation or leveling agents may be added either individually or in combination.

Plasticizers improve the coating and adhesion properties of the photoresist composition and better allow for the application of a thin coating or film of photoresist which is smooth and of uniform thickness onto the substrate. Plasticizers which may be used include, for example, phosphoric acid tri-(b-chloroethyl)-ester, stearic acid, dicamphor, polypropylene, acetal resins, phenoxy resins, and are added up to 10% by weight to a total weight of resin and sensitizer.

A light absorbing agent may be added to the composition of the invention to prevent halation from wafers. Preferably, the amount of the light absorbing agent added should not exceed 100 parts by weight to 100 parts by weight of the alkaline-soluble resin; preferably, the amount does not exceed 50 parts by weight, and more preferably, the amount does not exceed 30 parts by weight.

A crosslinking agent may be added to the photoresist composition of the invention in order to improve heat resistance, dry-etch resistance, and photospeed. An example of a useful crosslinking agent is the reaction product of formaldehyde with melamine, benzoguanamine, or glycoluril, epoxy compounds, aldehydes, azides, organic peroxides, and hexamethylenetetramine. The amount of crosslinking agent added should not exceed 10 parts by weight, and preferably 5 parts by weight, to a total weight of the photoresist compositon. It has been found that if the amount of crosslinking agent exceeds 10 parts by weight, the photospeed deteriorates and scum is formed on the wafer.

An adhesion promoter may also be added to the photoresist composition of the invention in order to improve the adhesion of the resist film to the wafer and to prevent exfoliation of the resist in the etching manufacturing process. Examples of useful adhesion promoters are trimethylchlorosilane, dimethylvinylchlorosilane, methyldiphenylchlorosilane, chloromethyldimethylchlorosilane, trimethylmethoxysilane, dimethyl-diethoxysilane, methyldimethoxysilane, dimethylvinylethoxysilane, diphenyldimethoxysilane, phenyltriethoxysilane, hexamethyldisilane, N,N'-bis(trimethylsilyl)urea, dimethyltrimethylsilylamine, trimethylsilylglyoxaline, vinyltrichlorosilane, gamma-chloropropyltrimethoxysilane, gamma-aminopropyltriethoxysilane, gamma-glycidoxypropyltrimethoxysilane, benzotriazole, benzimidazole, indazole, glyoxaline, 2-mercaptobenzimidazole, 2-mercaptobenzthiazole, 2-mercaptopyrimidine-1,1-dimethylurea, and 1,3-dimethylureathiocarbamide.

Preferably, the amount of the adhesion promoter added to the photoresist composition of the invention is less than 10 parts by weight per 100 parts of the resist composition, and more preferably less than 5 parts by weight.

The prepared radiation sensitive resist mixture, can be applied to a substrate by any conventional method used in the photoresist art, including dipping, spraying, whirling and spin coating. When spin coating, for example, the resist mixture can be adjusted as to the percentage of solids content in order to provide a coating of the desired thickness given the type of spinning equipment and spin speed utilized and the amount of time allowed for the spinning process. Suitable substrates include silicon, aluminum or polymeric resins, silicon dioxide, doped silicon dioxide, silicon resins, gallium arsenide, silicon nitride, tantalum, copper, polysilicon, ceramics and aluminum/copper mixtures. The coating surfaces of these substrates may or may not be primed with a conventional adhesion promoter (e.g., hexamethyldisilazane) before the photoresist coating is applied.

The photoresist coatings produced by the above described procedure are particularly suitable for application to silicon wafers coated with a silicon dioxide or silicon nitride layer such as are utilized in the production of microprocessors and other miniaturized integrated circuit components. An aluminum or aluminum-coated substrates may be used as well. The substrate may also comprise various polymeric resins especially transparent polymers such as polyesters and polyolefins.

After the resist solution is coated onto the substrate, the coated substrate is baked at approximately 70° C. to 125° C. until substantially all the solvent has evaporated and only a uniform radiation sensitive coating remains on the substrate. The coated substrate can then be exposed to radiation, especially ultraviolet radiation, in any desired exposure pattern, produced by use of suitable masks, negatives, stencils, templates, and the like. Conventional imaging process or apparatus currently used in processing photoresist-coated substrates may be employed with the present invention. While ultraviolet (UV) light is the preferred source of radiation, other sources of radiation such as visible light, electron or ion beam and X-ray radiant energy may be used instead.

The exposed resist-coated substrates are preferably subjected to a post exposure bake at a temperature from about 100° C. to about 130° C. from about 30–300 seconds to enhance image quality and resolution. The exposed resist-coated substrates are next developed in an aqueous alkaline solution. This solution is preferably agitated, for example, by nitrogen gas. Examples of aqueous alkaline developers include aqueous solutions of tetramethyl-ammonium hydroxide, sodium hydroxide, potassium hydroxide, ethanolamine, choline, sodium phosphates, sodium carbonate, sodium metasilicate, and the like. The preferred developers for this invention are aqueous solutions of either alkali metal hydroxides, phosphates or silicates, or mixtures thereof, or tetramethylammonium hydroxide.

Preferred development techniques include spray development or puddle development, or combinations thereof, may also be used.

The substrates are allowed to remain in the developer until all of the resist coating has dissolved from the exposed areas. Normally, development times from about 10 seconds to about 3 minutes are employed.

After selective dissolution of the coated wafers in the developing solution, they are preferably subjected to a deionized water rinse to fully remove the developer or any remaining undesired portions of the coating and to stop further development. This rinsing operation (which is part of the development process) may be followed by blow drying with filtered air to remove excess water. A post-development heat treatment or bake may then be employed to increase the coating's adhesion and chemical resistance to etching solutions and other substances. The post-development heat treatment can comprise the baking of the coating and substrate below the coating's thermal deformation temperature.

In industrial applications, particularly in the manufacture of microcircuitry units on silicon/silicon dioxide-type substrates, the developed substrates may then be treated with a buffered hydrofluoric acid etching solution or plasma gas etch. The resist compositions of the present invention are believed to be resistant to a wide variety of acid etching solutions or plasma gases and provide effective protection for the resist-coated areas of the substrate. Later, the remaining areas of the photoresist coating may be removed from the etched substrate surface by conventional photoresist stripping operations.

The present invention is further described in detail by means of the following examples. However, this invention is not limited by these. All parts are shown by weight percent, and all temperatures are in degrees Celsius, unless explicitly stated otherwise.

SYNTHESIS EXAMPLES 1–14 AND
COMPARATIVE SYNTHESES C-1–C-14

A. Synthesis of Novolak Resin:

The novolak resin of Synthesis Example I was synthesized according to the following general method. A phenolic monomer mixture of m-cresol (194.65 g; 1.80 mol),p-cresol (9.73 g; 0.09 mol), 2,3-xylenol (62.31 g; 0.51 mol), and p-methoxyphenol (74.49 g; 0.60 mol) was mixed with 37.17% formalin (222.98 g; 1.97 mol of formaldehyde) in a one-liter, three-necked flask equipped with a mechanical stirrer, a reflux condenser, and a thermometer. Oxalic acid dihydrate (1.13 g) was added to the reaction mixture at 90° C. while stirring. After 30 minutes of stirring, the bath temperature raised to 130° C. and the reaction mixture was heated at 100° C. for 3.5 hours. The bath temperature was then gradually raised to 200° C. over about 1 hour to remove remaining unreacted formalin and water. The pressure inside the reaction vessel was gradually reduced to 1 mm Hg over 60 minutes to remove unreacted monomers. The resulting novolak resin had a weight-average molecular weight of 4,260 as measured by gel permeation chromatography (GPC) with a polystyrene standard.

The novolak resin obtained above (approximately 100 g) was dissolved in 1,000 g of acetone, and 1,000 g of n-hexane was added to the novolak solution with vigorous stirring at room temperature. After stirring for 30 minutes, the solution was allowed to stand for 1 hour to allow the phases to separate. After the upper phase was removed by decantation, the solvents were removed from the remaining lower phase by rotary evaporation to obtain a solid novolak resin. The fractionated novolak resin had a weight-average molecular weight of about 8,630 as determined by GPC, and a polydispersity of 2.4.

Other novolak resins (Synthesis Examples 2–14 and Comparative syntheses C-1 to C-14) were made in the same manner as described above, except that the mole ratios of the monomers (e.g., m-cresol, p-cresol, xylenol, and methoryphenol) were different, as shown in Table 1 where fractionation methods A and B mean that the fractionation was carried out by dissolving 100 g of the novolak resin in 1,000 g of acetone and then precipitating the mixture using 1,000 g (A) or 2,000 g (B) of n-hexane, respectively. In Table 1, "Mole" refers to the molar ratio in the feedstock of m-cresol/p-cresol/xylenol/methoxyphenol. "$P_d$" is the polydispersity of molecular weight (defined as $M_w/M_n$). Alkali-dissolution speed (Å/sec) was determined in 2.38 wt % TMAH aqueous developer at 23° C.

Other PACs, S-3 and S-4, were synthesized using different polyphenolic compounds (C) and (D) as shown in Table 2 according to the same method as described for PAC S-2.

In Table 2, DNQ is 1,2-napthoquinonediazide-5-sulfonyl chloride. "Backbone" refers to structures of polyphenolic compounds (A) to (D) shown below. "Amine" refers to the esterification catalyst, i.e., NMPI is N-methylpiperidine; TEA is triethylamine.

TABLE 1

SYNTHESIS EXAMPLES OF NOVOLAX RESINS (1–14) AND COMPARATIVE SYNTHESES (C-1–C-14)

| Synthesis | Xylenol | Methoxyphenol | Mole | $M_w$ | $M_w$ (Fract.) | Fract. Method | $P_d$ | Alkali Dissolution (Å/sec) |
|---|---|---|---|---|---|---|---|---|
| 1 | 2,3- | p- | 60/3/17/20 | 4,260 | 8,630 | A | 2.4 | 22 |
| 2 | 2,3- | p- | 50/3/27/20 | 3,870 | 7,110 | A | 2.3 | 36 |
| 3 | 2,3- | p- | 50/3/17/30 | 5,120 | 10,030 | A | 3.1 | 31 |
| 4 | 2,3- | p- | 70/3/17/10 | 5,530 | 12,040 | A | 3.2 | 6.2 |
| 5 | 2,3- | p- | 80/3/10/7 | 2,360 | 5,410 | A | 2.3 | 95 |
| 6 | 2,3- | m- | 50/3/27/20 | 3,650 | 6,030 | A | 2.6 | 20 |
| 7 | 2,3- | o- | 50/3/27/20 | 4,510 | 9,120 | A | 2.8 | 25 |
| 8 | 3,5- | p- | 60/3/17/20 | 4,150 | 8,350 | A | 2.9 | 33 |
| 9 | 3,5- | m- | 50/3/27/20 | 2,680 | 5,670 | B | 2.5 | 18 |
| 10 | 3,5- | o- | 70/3/17/10 | 6,210 | 15,020 | A | 3.7 | 4.5 |
| 11 | 3,4- | p- | 50/3/27/20 | 3,180 | 8,110 | A | 2.4 | 56 |
| 12 | 3,4- | m- | 70/3/17/10 | 5,270 | 8,620 | B | 2.6 | 38 |
| 13 | 3,4- | o- | 40/3/17/40 | 3,270 | 5,190 | A | 2.6 | 23 |
| 14 | 2,3- | p- | 60/3/17/20 | 4,540 | 9,440 | A | 3.5 | 18 |
| C-1 | 2,5- | p- | 50/3/17/20 | 3,990 | 7,310 | A | 2.2 | 38 |
| C-2 | 2,5- | p- | 60/3/27/20 | 4,120 | 8,480 | A | 2.5 | 20 |
| C-3 | 2,5- | m- | 50/3/27/20 | 3,510 | 5,890 | A | 2.5 | 19 |
| C-4 | 2,5- | o- | 50/3/27/20 | 4,730 | 9,540 | A | 2.8 | 23 |
| C-5 | 2,3- | p- | 60/0/20/20 | 4,190 | 8,410 | A | 2.4 | 23 |
| C-6 | 2,3- | p- | 60/5/15/20 | 4,310 | 8,790 | A | 2.4 | 21 |
| C-7 | 2,3- | p- | 60/10/10/20 | 4,270 | 8,660 | A | 2.4 | 22 |
| C-8 | 2,3- | p- | 50/3/27/20 | 6,090 | 12,510 | A | 4.5 | 12 |
| C-9 | 2,3- | p- | 50/3/27/20 | 5,860 | 13,770 | A | 3.7 | 2.7 |
| C-10 | 2,3- | p- | 50/3/27/20 | 2,430 | 3,280 | B | 2.4 | 119 |
| C-11 | 2,3- | p- | 50/3/27/20 | 6,340 | 21,900 | A | 3.7 | 4.1 |
| C-12 | 2,3- | p- | 50/3/27/20 | 2,130 | 2,810 | B | 2.1 | 90 |
| C-13 | 2,3- | None | 60/3/37/0 | 5,380 | 9,620 | A | 3.1 | 7.2 |
| C-14 | None | p- | 60/3/0/37 | 4,150 | 8,680 | A | 2.6 | 28 |

B. Synthesis of photoactive compound (PAC):

PAC S-1 was synthesized according to the following general method. 1,2-Naphthoquinonediazide-5-sylfonyl chloride (53.7 g; 0.189 mol) and the polyphenolic compound (A) described in Table 2 (38.9 g; 0.10 mol) were dissolved in 500 ml of acetone, followed by dropwise addition of N-methylpiperidine (20.8 g). The reaction mixture was stirred at 25° C. for 3 hours and then poured into 3 liters of 1% aqueous hydrochloric acid to precipitate the PAC. The precipitated PAC was collected by filtration, washed with water, and dried. The amount of PAC S-1 recovered was approximately 76.6 g (89% yield).

PAC S-2 was synthesized according to the following general method. 1,2-Naphthoquinonediazide-5-sulfonyl chloride (53.7 g; 0.189 mol) and the polyphenolic compound (B) described in Table 2 (53.7 g; 0.126 mol) were dissolved in 800 ml of acetone, followed by dropwise addition of triethylamine (21.2 g) The reaction mixture was stirred at 25° C. for 3 hours. The reaction product was collected as described above for PAC S-1. The yield of S-2 was 90.2 g (90% recovery).

TABLE 2

Synthesis of Photoactive Compounds

| PAC | DNQ | Backbone | Amine | Yield (g) | Recovery (%) |
|---|---|---|---|---|---|
| S-1 | 53.7 g (0.19 mole) | 38.9 g of (A) (0.10 mole) | NMPI (20.8 g) | 76.6 | 89 |
| S-2 | 53.7 g (0.19 mole) | 53.7 g of (B) (0.13 mole) | TEA (21.2 g) | 90.2 | 90 |
| S-3 | 53.7 g (0.19 mole) | 35.3 g of (C) (0.066 mole) | TEA (21.2 g) | 75.0 | 91 |
| S-4 | 53.7 g (0.19 mole) | 60.5 g of (D) (0.11 mole) | TEA (21.2 g) | 101.8 | 95 |

TABLE 2-continued

Structures of the PAC Backbones (A)

(B)

(C)

(D)

PHOTORESIST EXAMPLES 15–29 AND PHOTORESIST COMPARATIVE EXAMPLES C-15 TO C-32

In photoresist Example 15, the novolak resin #1 described above and the photoactive compound S-1 were dissolved in ethyl cellosolve acetate in the presence of the speed enhancer P-2 according to the formulation described in Table 3. The resulting solution was filtered with a membrane filter having a pore size of 0.1 micrometers, spun-coated onto a silicon wafer, and dried at 90° C. on a hot plate for 60 seconds in order to adjust the resist film thickness to about 0.97 micrometers. Photoresist Examples 16–29 and Photoresist Comparitive Examples C-15 to C-32 were made in the same manner.

In Table 3, "SEN" is defined as Speed Enhancer; P-1, P-2, and P-3, refer to the structures shown in the lower section of Table 3. Solvent Y-1 is ethyl cellsolve acetate; Solvent Y-2 is ethyl-2-hydroxypropionate; Solvent Y-3 is methyl-3-methoxypropionate; Solvent Y-4 is ethyl-3-ethoxypropionate.

TABLE 3

Formulation of Exemplary Photoresist Compositions (1–15) And Comparative Photoresist Compositions (C-15 TO C-32)

| Photo-resist Example | Resin No. | Resin gram | PAC No. | PAC gram | SEN No. | SEN gram | Solvent No. | Solvent gram |
|---|---|---|---|---|---|---|---|---|
| 15 | 1 | 100 | S-4 | 60 | P-2 | 40 | Y-1 | 630 |
| 16 | 2 | 100 | S-2 | 75 | P-1 | 40 | Y-2/Y-4 | 545/135 |
| 17 | 3 | 100 | S-3 | 75 | P-1 | 40 | Y-2/Y-4 | 545/135 |
| 18 | 4 | 100 | S-1 | 60 | P-1 | 50 | Y-2/Y-4 | 530/135 |
| 19 | 5 | 100 | S-2 | 80 | P-1 | 30 | Y-3 | 665 |
| 20 | 6 | 100 | S-4 | 75 | P-1 | 40 | Y-1 | 630 |
| 21 | 7 | 100 | S-1 | 75 | P-3 | 35 | Y-2/Y-4 | 530/135 |
| 22 | 8 | 100 | S-3 | 70 | P-1 | 35 | Y-3 | 650 |
| 23 | 9 | 100 | S-2 | 65 | P-2 | 45 | Y-2/Y-4 | 505/125 |
| 24 | 10 | 100 | S-2 | 60 | P-1 | 50 | Y-1 | 665 |
| 25 | 11 | 100 | S-4 | 75 | P-1 | 35 | Y-2/Y-4 | 530/135 |
| 26 | 12 | 100 | S-3 | 75 | P-2 | 35 | Y-3 | 665 |
| 27 | 13 | 100 | S-4 | 75 | P-1 | 40 | Y-2/Y-4 | 545/135 |
| 28 | 14 | 100 | S-1 | 75 | P-1 | 40 | Y-1 | 680 |
| 29 | 2 | 100 | S-1/S-4 | 35/35 | P-1 | 40 | Y-2/Y-4 | 530/135 |
| C-15 | C-1 | 100 | S-2 | 75 | P-1 | 40 | Y-2/Y-4 | 545/135 |
| C-16 | C-2 | 100 | S-4 | 60 | P-1 | 40 | Y-1 | 630 |
| C-17 | C-3 | 100 | S-4 | 75 | P-1 | 30 | Y-1 | 650 |
| C-18 | C-4 | 100 | S-1 | 75 | P-3 | 35 | Y-2/Y-4 | 530/135 |
| C-19 | C-5 | 100 | S-4 | 60 | P-2 | 40 | Y-1 | 630 |
| C-20 | C-6 | 100 | S-4 | 60 | P-2 | 40 | Y-1 | 630 |
| C-21 | C-7 | 100 | S-4 | 60 | P-2 | 40 | Y-1 | 630 |
| C-22 | C-8 | 100 | S-2 | 75 | P-1 | 40 | Y-2/Y-4 | 545/135 |
| C-23 | C-9 | 100 | S-2 | 75 | P-1 | 40 | Y-2/Y-4 | 545/135 |
| C-24 | C-10 | 100 | S-2 | 75 | P-1 | 40 | Y-2/Y-4 | 545/135 |
| C-25 | C-11 | 100 | S-2 | 75 | P-1 | 40 | Y-2/Y-4 | 545/135 |
| C-26 | C-12 | 100 | S-1 | 75 | P-1 | 40 | Y-2/Y-4 | 545/135 |
| C-27 | C-13 | 100 | S-4 | 70 | P-2 | 45 | Y-1 | 680 |
| C-28 | C-14 | 100 | S-4 | 75 | P-2 | 4S | Y-1 | 695 |
| C-29 | 2 | 100 | S-2 | 110 | P-1 | 40 | Y-2/Y-4 | 630/160 |
| C-30 | 2 | 100 | S-2 | 30 | P-1 | 40 | Y-2/Y-4 | 430/110 |
| C-31 | 2 | 100 | S-2 | 75 | P-1 | 65 | Y-2/Y-4 | 610/150 |
| C-32 | 2 | 100 | S-2 | 75 | P-1 | 5 | Y-2/Y-4 | 450/110 |

Structures of Speed Enhancers (P-1)

(P-2)

(P-3)

The photoresist film was exposed by using a reduction projection exposure apparatus (NSR-200Si9C) manufactured by Nikon Corporation, and subjected to post-exposure bake (PEB) 110° C. for 60 seconds. The film was developed with 2.38% aqueous tetramethylammonium hydroxide (TMAH) for 60 seconds, washed with water for 30 seconds, and dried.

The resist pattern thus-obtained on the silicon wafers was inspected by using a scanning electron microscope (SEM) to evaluate the resist performance. The result is shown in Table 4 where sensitivity is defined as the reciprocal of the exposure amount necessary for reproducing a mask pattern of 0.40 μm was determined as a relative value to the sensitivity of the resist composition of Example 16 as shown in Table 3. The resolution was determined as critical resolving power in an exposure amount necessary for reproducing a mask pattern of 0.40 μm. The defocus latitude (DOF) was determined as a width of focus separating without film reduction of a resist pattern of 0.40 μm in the effective sensitivity from a section with the scanning electron microscope.

TABLE 4

LITHOGRAPHIC PERFORMANCE OF EXEMPLARY AND COMPARATIVE PHOTORESISTS

| Photoresist Example | Relative Photospeed | Resolution (μm) | DOF (μm) |
|---|---|---|---|
| 15 | 1.2 | 0.29 | 1.8 |
| 16 | 1.4 | 0.28 | 1.8 |
| 17 | 1.1 | 0.29 | 1.8 |
| 18 | 1.1 | 0.29 | 1.7 |
| 19 | 1.5 | 0.30 | 1.6 |
| 20 | 1.2 | 0.29 | 1.8 |
| 21 | 1.2 | 0.29 | 1.8 |
| 22 | 1.1 | 0.29 | 1.8 |
| 23 | 1.1 | 0.29 | 1.8 |
| 24 | 1.1. | 0.30 | 1.7 |
| 25 | 1.2 | 0.29 | 1.8 |
| 26 | 1.3 | 0.30 | 1.7 |
| 27 | 1.2 | 0.30 | 1.7 |
| 28 | 1.2 | 0.29 | 1.8 |
| 29 | 1.5 | 0.28 | 1.8 |
| C-15 | 1.0 | 0.32 | 1.4 |
| C-16 | 0.9 | 0.32 | 1.3 |
| C-17 | 0.8 | 0.31 | 1.3 |
| C-18 | 0.9 | 0.32 | 1.4 |
| C-19 | 1.1 | 0.31 | 1.4 |
| C-20 | 1.1 | 0.31 | 1.3 |
| C-21 | 0.9 | 0.32 | 1.2 |
| C-22 | 1.2 | 0.34 | 1.1 |
| C-23 | 0.7 | 0.35 | 0.8 |
| C-24 | 1.3 | 0.35 | 0.8 |
| C-25 | 0.8 | 0.33 | 1.4 |
| C-26 | 1.4 | 0.36 | 0.7 |
| C-27 | 0.9 | 0.30 | 1.5 |
| C-28 | 0.8 | 0.34 | 1.2 |
| C-29 | 0.6 | 0.38 | 1.0 |
| C-30 | 0.9 | 0.40 | 0.6 |
| C-31 | 1.3 | 0.36 | 0.8 |
| C-32 | 0.6 | 0.36 | 1.1 |

While the invention has been described above with reference to specific embodiments thereof, it is apparent that many changes, modifications, and variations can be made without departing from the inventive concept disclosed herein. Accordingly, it is intended to embrace all such changes, modifications, and variations that fall within the spirit and broad scope of the appended claims. All patent applications, patents, and other publications cited herein are incorporated by reference in their entirety.

What is claimed is:

1. An alkali-soluble novolak binder resin made by addition condensation reaction of a phenolic mixture with at least one aldehyde source, the feedstock of said phenolic mixture for said reaction comprising:

(1) about 33 to about 83 mole percent of said phenolic mixture being meta-cresol;

(2) about 1 to about 4 mole percent of said phenolic mixture being para-cresol;

(3) about 10 to about 60 mole percent of said phenolic mixture being a phenolic monomer selected from the group consisting of 2,3-xylenol, 3,4-xylenol, 3,5-xylenol and mixtures thereof; and (4) about 5 to about 55 mole percent of said phenolic mixture being a methoxy phenol monomer selected from the group consisting of para-methoxyphenol, meta-methoxyphenol, ortho-methoxyphenol and mixtures thereof;

the amount of said aldehyde source being from about 40 to about 200 percent of the stoichiometric amount needed to react with all of the phenolic moieties in said phenolic mixture; and said alkali-soluble novolak binder resin having a weight-average molecular weight ($M_w$) of about 3,000 to about 20,000 with a molecular weight dispersity ($M_w/M_n$) of 1.5–4.0 and a dissolution rate in a 2.38 percent by weight aqueous solution of tetramethylammonium hydroxide (TMAH) of 3–100 angstroms per second at 23° C.

2. The alkali-soluble novolak binder resin of claim 1, wherein the feedstock of said phenolic mixture for said reaction comprises about 40 to about 70 mole percent of meta-cresol; about 2 to about 4 mole percent of para-cresol; about 15 to about 45 mole percent of a phenolic monomer selected from the group consisting of 2,3-xylenol, 3,4-xylenol, 3,5-xylenol and mixtures thereof; and about 10 to about 40 mole percent of a methoxyphenol monomer selected from the group consisting of para-methoxyphenol, meta-methoxyphenol, ortho-methoxyphenol and mixtures thereof.

3. The alkali-soluble novolak binder resin of claim 1, wherein the feedstock of said phenolic mixture for said reaction comprises about 45 to about 60 mole percent of meta-cresol; about 1 to about 2 mole percent of para-cresol; about 15 to about 30 mole percent of a phenolic monomer selected from the group consisting of 2,3-xylenol, 3,4-xylenol, 3,5-xylenol and mixtures thereof; and about 15 to about 30 mole percent of a methoxy phenol monomer selected from the group consisting of para-methoxyphenol, meta-methoxyphenol, ortho-methoxyphenol and mixtures thereof.

4. The alkali-soluble novolak binder resin of claim 1, wherein said aldehyde source is selected from the group consisting of formaldehyde, paraformaldehyde, trioxane, acetaldehyde, chloroacetaldehyde and combinations thereof.

5. The alkali-soluble novolak binder resin of claim 1, wherein said alkali-soluble novolak binder resin has a weight-average molecular weight ($M_w$) of about 4,000 to about 18,000.

6. The alkali-soluble novolak binder resin of claim 1, wherein said alkali-soluble novolak binder resin has a weight-average molecular weight ($M_w$) of about 5,000 to about 16,000.

7. The alkali-soluble novolak binder resin of claim 1, wherein said alkali-soluble novolak binder resin has a molecular weight dispersity ($M_w/M_n$) of 1.8–3.5.

8. The alkali-soluble novolak binder resin of claim 1, wherein said alkali-soluble novolak binder resin has a molecular weight dispersity ($M_w/M_n$) of 2.0–3.3.

9. The alkali-soluble novolak binder resin of claim 1, wherein said addition condensation reaction utilizes and acid catalyst selected from the group consisting of hydrochloric acid, sulfuric acid, formic acid, acetic acid, oxalic acid, and combinations thereof.

10. A positive-working photoresist composition comprising the admixture of:

(a) an alkali-soluble novalak binder resin made by addition condensation reaction of a phenolic mixture with at least one aldehyde source, the feedstock said phenolic mixture for said reaction comprising:

(1) about 33 to about 83 mole percent of said phenolic mixture being meta-cresol;

(2) about 1 to about 4 mole percent of said phenolic mixture being para-cresol;

(3) about 10 to about 60 mole percent of said phenolic mixture being a phenolic monomer selected from the group consisting of 2,3-xylenol, 3,4-xylenol, 3,5-xylenol; and mixtures thereof; and (4) about 5 to about 55 mole percent of said phenolic mixture being a methoxy phenol monomer selected from the group consisting of para-methoxyphenol, meta-methoxyphenol, ortho-methoxy phenol the amount of said aldehyde source being from about 40 percent to about 200 percent of the stoichiometric amount needed to react with all of the phenolic moieties in said phenolic mixture and mixtures thereof; and said alkali-soluble novolak binder resin having a weight average molecular weight ($M_w$) of about 3,000 to about 20,000 with a molecular weight dispersity ($M_w/M_n$) of 1.5–4.0 and a dissolution rate in a 2.38 percent by weight aqueous solution of tetramethylammonium hydroxide (TMAH) of 3–100 Angstroms per second at 23° C.;

(b) at least one photoactive compound, the amount of said photoactive compound or compounds being 35 to 100 percent by weight of said novolak binder resin; and (c) at least one polyhydroxy compound having 2 to 7 phenolic groups and a weight average molecular weight ($M_w$) below about 1000; the amount of said polyhydroxy compound or compounds being about 10 to about 60 percent by weight of said novalak binder resin.

11. The positive-working photoresist composition of claim 10, wherein said photoactive compound is selected from the group consisting of 1,2-napthoquinonediazide-5-sulfonyl chloride, 1,2-naphthoquinonediazide-4-sulfonyl chloride, and combinations thereof.

12. The positive-working photoresist composition of claim 10, wherein said polyhydroxy compound is selected from the group consisting of formulae (A)–(D) and mixtures thereof:

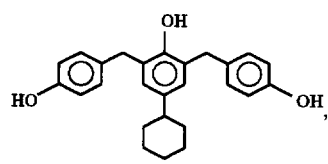

(A)

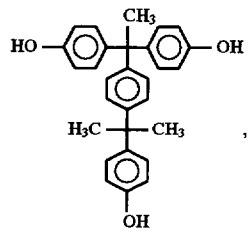

(B)

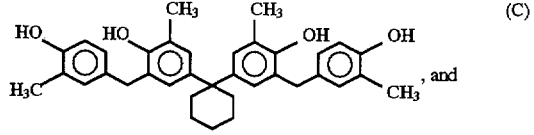

(C)

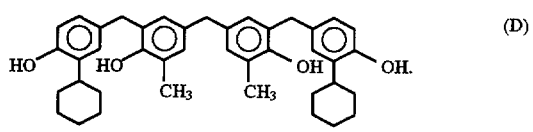

(D)

13. The positive-working photoresist composition of claim 10, further comprising a speed enhancer.

14. The positive-working photoresist composition of claim 13, wherein said speed enhancer is selected from the group consisting of formulae (P-1)–(P-3) and mixtures thereof:

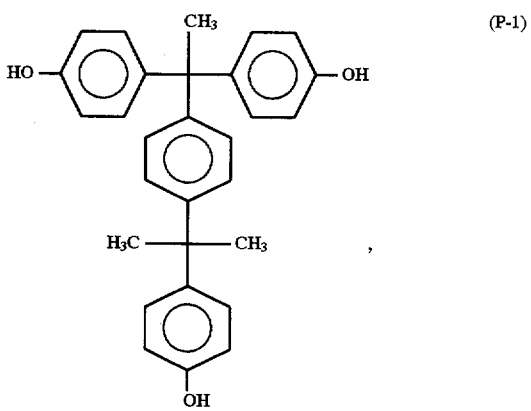

(P-1)

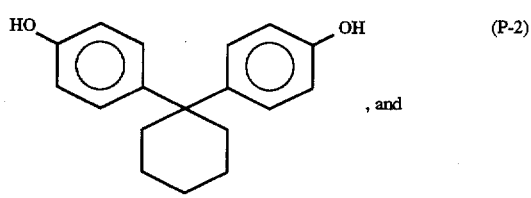

(P-2)

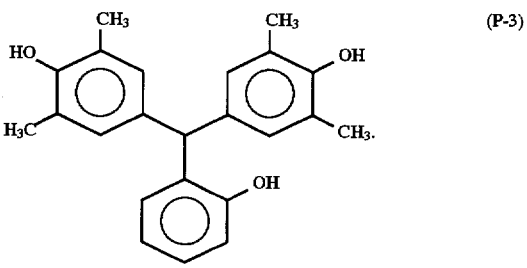

(P-3)

* * * * *